USO10141876B2

(12) United States Patent
Sasaki et al.

(10) Patent No.: US 10,141,876 B2
(45) Date of Patent: Nov. 27, 2018

(54) POWER GENERATOR SYSTEM, POWER GENERATOR CONTROL DEVICE, AND POWER-GENERATION BALANCE CONTROL METHOD FOR POWER GENERATOR SYSTEM

(71) Applicant: Mitsubishi Electric Corporation, Tokyo (JP)

(72) Inventors: Junya Sasaki, Tokyo (JP); Keisuke Katsurada, Tokyo (JP); Masahiro Nakajima, Tokyo (JP); Katsuyuki Sumimoto, Tokyo (JP)

(73) Assignee: Mitsubishi Electric Corporation, Chiyoda-ku, Tokyo (JP)

( * ) Notice: Subject to any disclaimer, the term of this patent is extended or adjusted under 35 U.S.C. 154(b) by 19 days.

(21) Appl. No.: 15/523,469

(22) PCT Filed: Nov. 18, 2014

(86) PCT No.: PCT/JP2014/080475
§ 371 (c)(1),
(2) Date: May 1, 2017

(87) PCT Pub. No.: WO2016/079800
PCT Pub. Date: May 26, 2016

(65) Prior Publication Data
US 2017/0317629 A1 Nov. 2, 2017

(51) Int. Cl.
H02P 9/30 (2006.01)
H02P 9/38 (2006.01)
(Continued)

(52) U.S. Cl.
CPC .............. H02P 9/307 (2013.01); G01R 31/44 (2013.01); H02P 9/14 (2013.01); H02P 9/38 (2013.01);
(Continued)

(58) Field of Classification Search
CPC .............. H02P 9/307; H02P 9/38; H02P 9/14
See application file for complete search history.

(56) References Cited

U.S. PATENT DOCUMENTS 8,847,442 B2 * 9/2014 Taira .................... H02M 7/537
307/151
9,716,456 B2 * 7/2017 Maruyama .............. H02P 23/00
(Continued)

FOREIGN PATENT DOCUMENTS

JP 04-038131 A 2/1992
JP 06-070482 A 3/1994
(Continued)

OTHER PUBLICATIONS

International Search Report for PCT/JP2014/080475 dated Feb. 24, 2015.

Primary Examiner — Viet Nguyen
(74) Attorney, Agent, or Firm — Sughrue Mion, PLLC; Richard C. Turner

(57) ABSTRACT

A master generator is configured to use a duty upper limit value and a duty lower limit value to perform duty restriction processing on a PWM signal in continuous Y cycles out of generated X cycles, and transmit the PWM signal after the restriction processing to a slave generator. The slave generator is configured to receive the PWM signal after the restriction processing transmitted from the master generator as a received PWM signal, and determine that a reception abnormality exists when the received PWM signal is received as a signal representing a duty less than the duty lower limit value or a duty more than the duty upper limit value in continuous (X−Y+1) cycles.

5 Claims, 11 Drawing Sheets

(51) Int. Cl.
  *H02P 9/14* (2006.01)
  *G01R 31/44* (2006.01)
  *G01R 31/00* (2006.01)
  *G01R 31/02* (2006.01)
  *H02J 7/14* (2006.01)
  *H02J 7/16* (2006.01)

(52) U.S. Cl.
  CPC .......... *G01R 31/006* (2013.01); *G01R 31/024* (2013.01); *H02J 7/14* (2013.01); *H02J 7/166* (2013.01); *H02J 2007/143* (2013.01)

(56) References Cited

U.S. PATENT DOCUMENTS

| | | | | |
|---|---|---|---|---|
| 2002/0158470 A1* | 10/2002 | Suzuki | ................ | H02M 5/4585 290/1 A |
| 2002/0191417 A1* | 12/2002 | Suzuki | ................ | H02M 5/458 363/15 |
| 2008/0084190 A1* | 4/2008 | Harmon | ................ | H02J 7/245 322/28 |
| 2010/0013443 A1* | 1/2010 | Hodge | ................ | H02P 9/48 322/28 |
| 2012/0096881 A1* | 4/2012 | Sakanobe | ............. | F25B 49/025 62/126 |
| 2012/0098503 A1* | 4/2012 | Horihata | ................ | H02P 9/08 322/23 |
| 2013/0056983 A1 | 3/2013 | Katsurada et al. | | |
| 2014/0203756 A1* | 7/2014 | Kajiura | ................ | H02M 7/493 318/812 |
| 2015/0311848 A1* | 10/2015 | Maruyama | ............... | H02J 7/163 318/490 |
| 2017/0170766 A1* | 6/2017 | Kim | ........................ | B60L 15/08 |

FOREIGN PATENT DOCUMENTS

| | | |
|---|---|---|
| JP | 3061700 B2 | 7/2000 |
| JP | 2009-213222 A | 9/2009 |
| WO | 2012/029104 A1 | 3/2012 |
| WO | 2014/006686 A1 | 1/2014 |

* cited by examiner

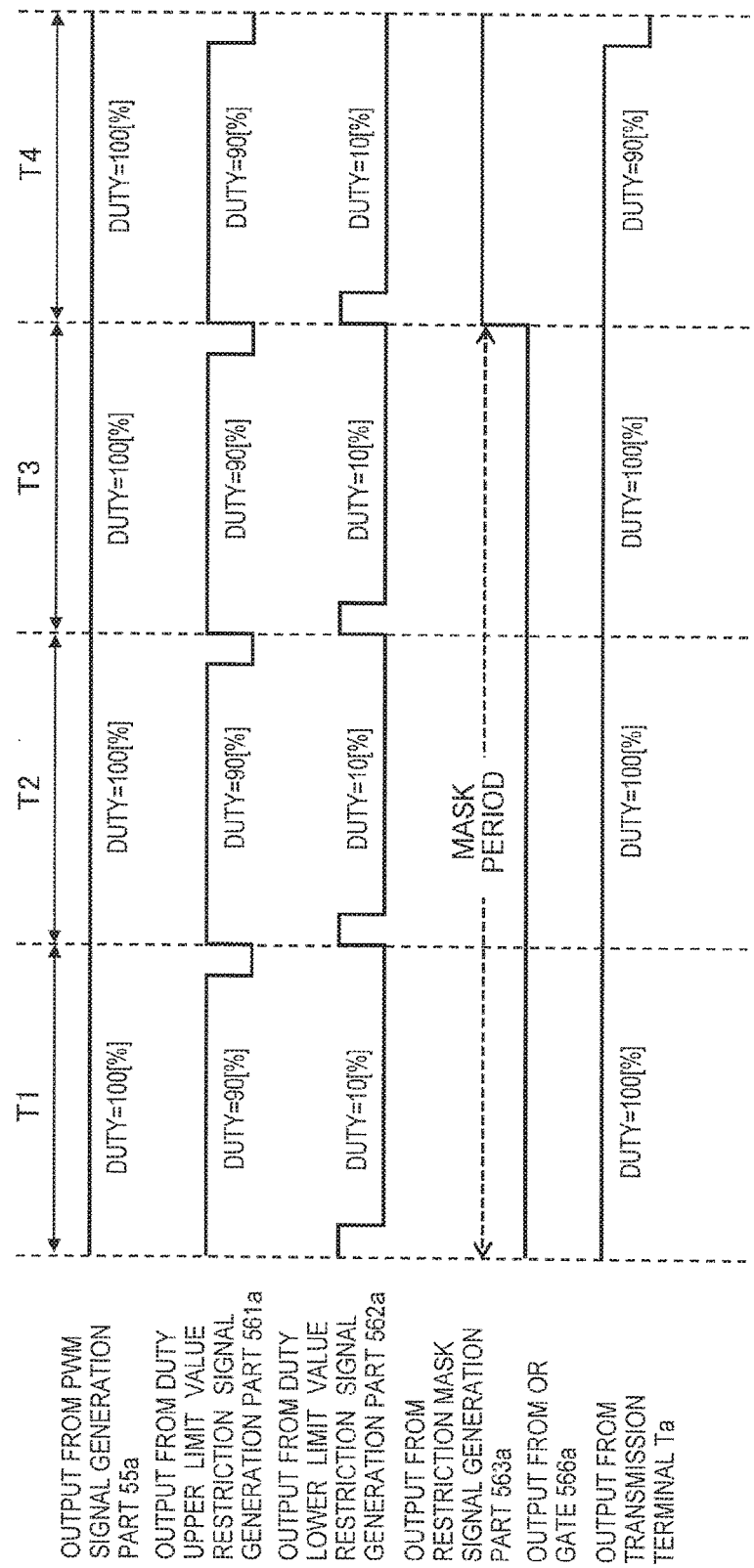

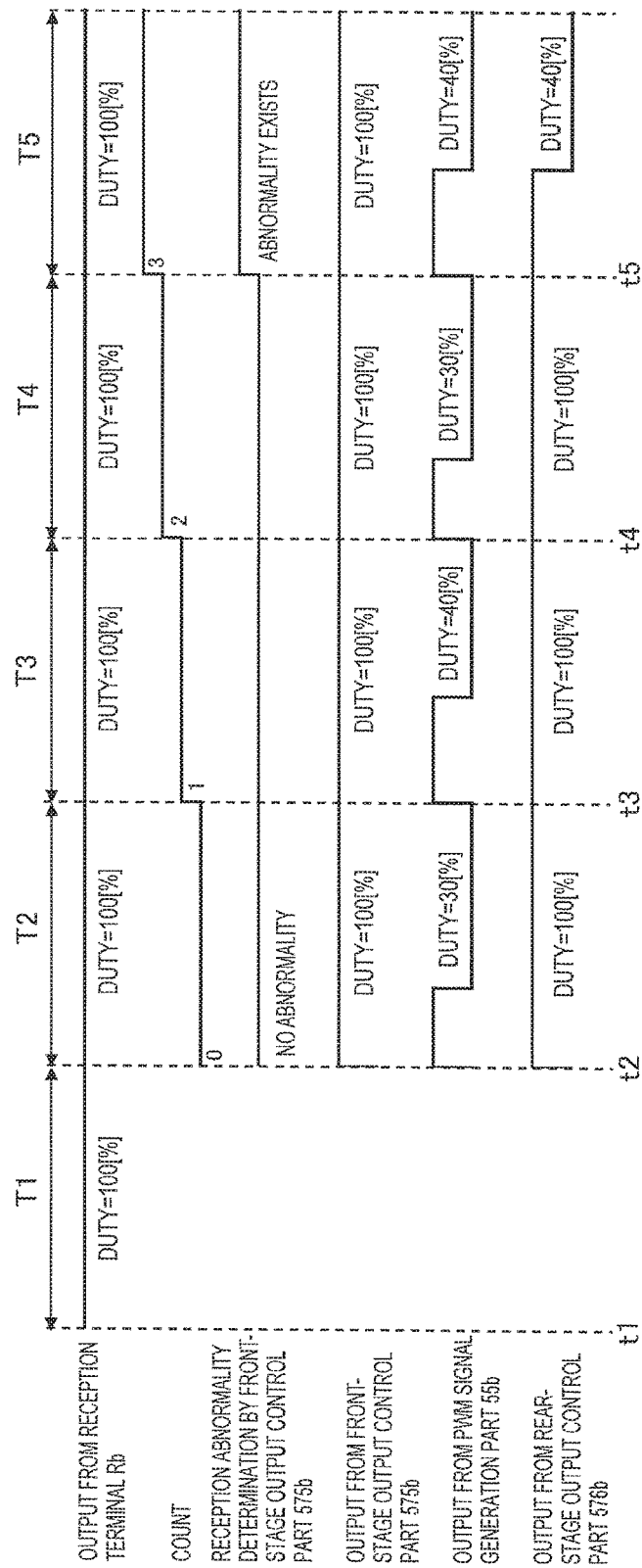

POWER GENERATOR SYSTEM, POWER GENERATOR CONTROL DEVICE, AND POWER-GENERATION BALANCE CONTROL METHOD FOR POWER GENERATOR SYSTEM

CROSS REFERENCE TO RELATED APPLICATIONS

This application is a National Stage of International Application No. PCT/JP2014/080475filed Nov. 18, 2014, the contents of all of which are incorporated herein by reference in their entirety.

TECHNICAL FIELD

The present invention relates to a generator system, a generator control device, and a power-generation balance control method for a generator system, for detecting a reception abnormality on a slave generator side that may occur when the slave generator receives a pulse width modulation (PWM) signal transmitted from a master generator.

BACKGROUND ART

In a related-art generator for a vehicle, there is installed a generator control device capable of controlling a field current to be supplied to a field coil, thereby adjusting an output voltage of a generator. Moreover, there exists such a related-art generator for a vehicle having a configuration in which a plurality of generators are installed in one internal combustion engine, and the plurality of generators simultaneously generate electricity (for example, refer to Patent Literature 1).

In particular, in the related art described in Patent Literature 1, a generator control device for a master generator installed in the master generator is configured to transmit a field current on-off control signal for controlling supply of a field current to a field coil of the master generator to a generator control device for a slave generator installed in the slave generator. Moreover, the generator control device for the slave generator is configured to control supply of a field current to a field coil of the slave generator in accordance with the field current on-off control signal received from the generator control device for the master generator. The field current on-off control signal described in Patent Literature 1 corresponds to a PWM signal of the present invention.

Thus, through the configuration of the generator control devices as described above, the generator control device for the master generator and the generator control device for the slave generator can use the same field current on-off control signal to control the supply of the field currents to the field coils. Therefore, the power-generation balance between the master generator and the slave generator can be maintained to be equal.

CITATION LIST

Patent Literature

[PTL 1] JP 2009-213222 A

SUMMARY OF INVENTION

Technical Problem

However, the related art has the following problem.

In the related art described in Patent Literature 1, a terminal of the master generator and a terminal of the slave generator are connected to each other via a cable so that the field current on-off control signal is transmitted from the master generator to the slave generator via the cable connecting the terminals.

On this occasion, when a reception abnormality on the slave generator side caused by a defect of the cable, for example, detachment of the cable connecting the terminals, occurs, the slave generator cannot correctly receive the field current on-off control signal transmitted from the master generator. In other words, the field current on-off control signal transmitted from the main generator and the field current on-off control signal received by the slave generator are different from each other.

The reception abnormality on the slave generator side may occur as described above when the field current on-off control signal transmitted from the master generator is received by the slave generator. Thus, when the reception abnormality on the slave generator side actually occurs, a configuration for detecting such a reception abnormality is necessary.

The present invention has been made in view of the above-mentioned problem, and therefore has an object to provide a generator system, a generator control device, and a power-generation balance control method for a generator system, which are capable of detecting a reception abnormality on a slave generator side that may occur when the slave generator receives a PWM signal transmitted from a master generator.

According to one embodiment of the present invention, there is provided a generator system, including: a first generator control device including a first PWM signal generation part configured to generate a first PWM signal, the first generator control device being configured to control, based on the first PWM signal, a first field current to be supplied to a field coil of a first generator; and a second generator control device including a second PWM signal generation part configured to generate a second PWM signal, the second generator control device being configured to control, based on the second PWM signal, a second field current to be supplied to a field coil of a second generator, in which: the first generator control device further includes a duty restriction part configured to use a duty lower limit value that is more than 0% and a duty upper limit value that is less than 100% to perform, every X cycles, duty restriction processing on the first PWM signal generated by the first PWM signal generation part in continuous Y cycles out of the X cycles, and to transmit the first PWM signal after the restriction processing to the second generator control device; the second generator control device further includes a signal output control part configured to: receive the first PWM signal after the restriction processing transmitted from the duty restriction part as a received PWM signal; determine that a reception abnormality exists when the received PWM signal is received continuously in (X−Y+1) cycles as a signal representing a duty less than the duty lower limit value or a duty more than the duty upper limit value; control the second field current based on the second PWM signal generated by the second PWM signal generation part in a cycle in which the reception abnormality is determined to exist; and control the second field current based on the received PWM signal in a cycle in which the reception abnormality is not determined to exist; and X and Y are integers satisfying X>Y>0.

Moreover, the generator control device according to the one embodiment of the present invention is to be applied to the generator system and is anyone of the first generator control device and the second generator control device.

According to one embodiment of the present invention, there is provided a power-generation balance control method for a generator system, for equalizing a power-generation balance between a first generator and a second generator in the generator system, the generator system including: a first generator control device including a first PWM signal generation part configured to generate a first PWM signal, the first generator control device being configured to control, based on the first PWM signal, a first field current to be supplied to a field coil of the first generator; and a second generator control device including a second PWM signal generation part configured to generate a second PWM signal, the second generator control device being configured to control, based on the second PWM signal, a second field current to be supplied to a field coil of the second generator, the power-generation balance control method including: a duty restriction processing step of using, by the first generator control device, a duty lower limit value that is more than 0% and a duty upper limit value that is less than 100% to perform, every X cycles, duty restriction processing on the first PWM signal generated by the first PWM signal generation part in continuous Y cycles out of the X cycles, and transmitting the first PWM signal after the restriction processing to the second generator control device; and a signal output control step of receiving, by the second generator control device, the first PWM signal after the restriction processing transmitted from the first generator control device in the duty restriction processing step as a received PWM signal, determining that a reception abnormality exists when the received PWM signal is received continuously in (X−Y+1) cycles as a signal representing a duty less than the duty lower limit value or a duty more than the duty upper limit value, controlling the second field current based on the second PWM signal generated by the second PWM signal generation part in a cycle in which the reception abnormality is determined to exist, and controlling the second field current based on the received PWM signal in a cycle in which the reception abnormality is not determined to exist, in which X and Y are integers satisfying X>Y>0.

Advantageous Effects of Invention

According to the present invention, the slave generator is configured to receive the PWM signal after the restriction processing transmitted from the main generator as the received PWM signal, and determine that the reception abnormality exists when the received PWM signal is received as a signal representing the duty less than the duty lower limit value or the duty more than the duty upper limit value in the continuous (X−Y+1) cycles. Therefore, it is possible to provide the generator system, the generator control device, and the power-generation balance control method for a generator system, which are capable of detecting the reception abnormality on the slave generator side that may occur when the slave generator receives the PWM signal transmitted from the master generator.

BRIEF DESCRIPTION OF DRAWINGS

FIG. 5A is an explanatory diagram for illustrating a first example of a transmitted PWM signal output by the duty restriction part of a master generator according to the first embodiment of the present invention.

FIG. 5C is an explanatory diagram for illustrating a first example of the control PWM signal output by the signal output control part of the slave generator after the signal output control part receives the transmitted PWM signal illustrated in FIG. 5A when the reception abnormality is occurring according to the first embodiment of the present invention.

DESCRIPTION OF EMBODIMENTS

Now, a generator system, a generator control device, and a power-generation balance control method for a generator system according to exemplary embodiments of the present invention are described referring to the accompanying drawings. In the description of the drawings, the same components are denoted by the same reference symbols, and the overlapping description thereof is herein omitted.

First Embodiment

Figure 1:
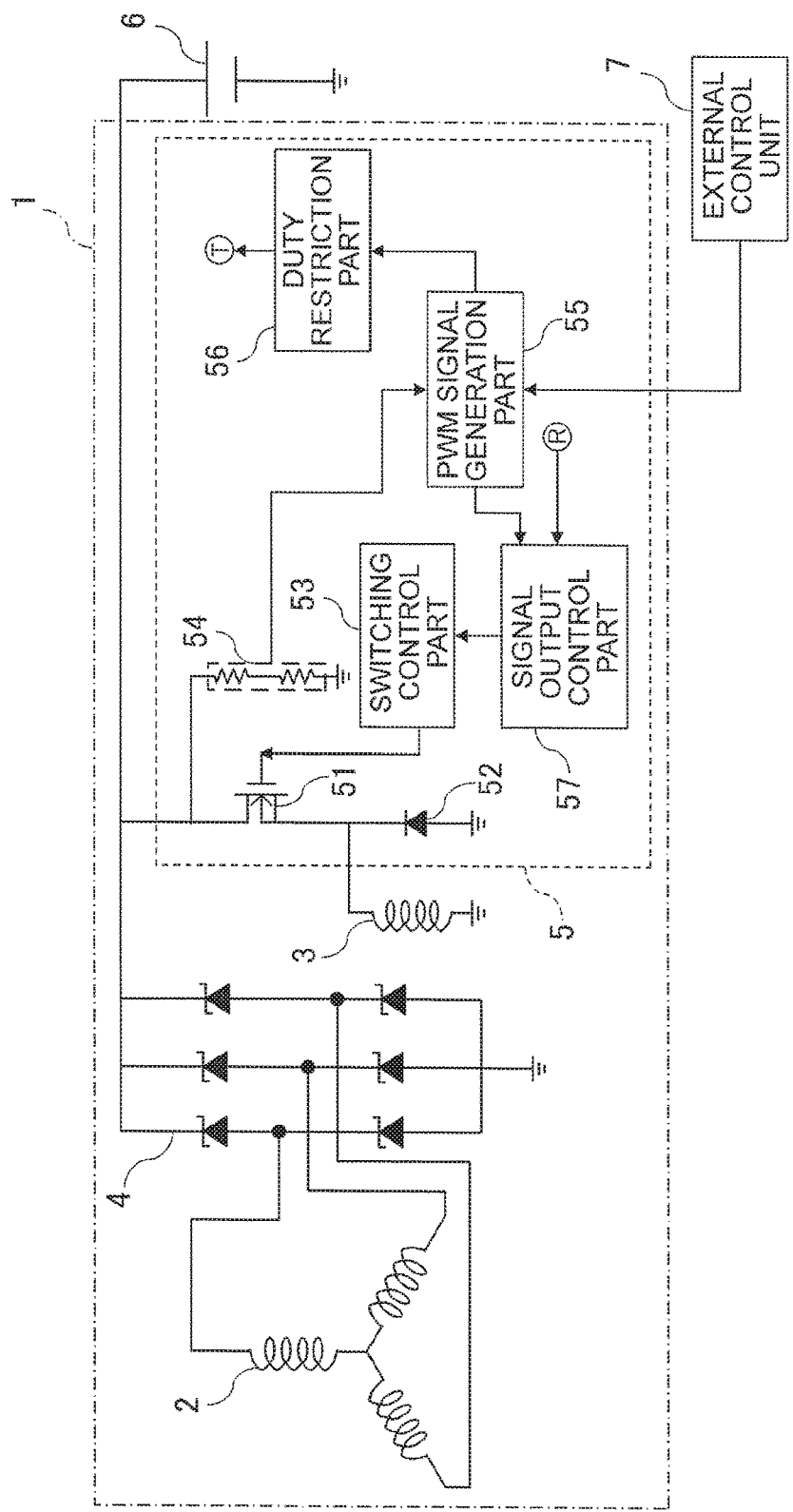
FIG. 1 is a configuration diagram for illustrating a generator for a vehicle including a generator control device according to a first embodiment of the present invention.

FIG. 1 is a configuration diagram for illustrating a generator for a vehicle including a generator control device according to a first embodiment of the present invention. The generator for a vehicle 1 (hereinafter simply referred to as "generator 1") of FIG. 1 includes a stator coil 2, a field coil 3, a rectifier 4, and a generator control device 5 (hereinafter simply referred to as "control device 5"). In FIG. 1, a battery 6 and an external control unit 7 connected to the generator 1 are also illustrated.

A driving force is transmitted to the generator 1 from a crankshaft of an engine. The generator 1 is configured to receive a driving force from the engine, thereby generating electricity. The stator coil 2 is configured to generate AC output. The field coil 3 is configured to generate magnetic flux required for the generator 1 to generate electricity. The rectifier 4 includes a three-phase full-wave rectification mechanism for converting the AC output generated by the stator coil 2 to a DC.

The battery 6 is installed in a vehicle, and, for example, a lead storage battery is used. The battery 6 is connected to the generator 1, and is configured to accumulate electric power generated by the generator 1.

The external control unit 7 is connected to the generator 1, and is configured to control a power-generation state of the generator 1. Specifically, the external control unit 7 outputs vehicle information such as an engine state, a vehicle travel state, an accelerator opening degree, and a brake depression amount, and a battery voltage of the battery 6 to the control device 5 as external information.

The control device 5 is configured to control the field coil 3 by the PWM method. The control device 5 includes a transistor 51, a diode 52, a switching control part 53, a voltage detection part 54, a PWM signal generation part 55, a duty restriction part 56, a signal output control part 57, a transmission-side terminal T, and a reception-side terminal R.

Switching control between on and off is carried out for the transistor 51 by the switching control part 53. When the transistor 51 is on, the field current is supplied to the field coil 3, and thus electricity is generated. On the other hand, when the transistor 51 is off, the field current is not supplied to the field coil 3, and thus electricity is not generated. The diode 52 is connected in parallel with the field coil 3, and is configured to absorb surge.

The switching control part 53 is configured to carry out the switching control of switching the transistor 51 to any one of on and off. The switching control part 53 is configured to carry out the switching control for the transistor 51 in accordance with a control PWM signal input from the signal output control part 57.

The voltage detection part 54 is connected to a DC output line of the rectifier 4, and is configured to divide the voltage of the rectifier 4 and detect the output voltage of the generator 1 as a detection voltage. The voltage detection part 54 is configured to output the detection voltage to the PWM signal generation part 55.

The PWM signal generation part 55 is configured to generate a PWM signal for controlling the field current to be supplied to the field coil 3 as a generated PWM signal in accordance with the external information input from the external control unit 7 and the detection voltage input from the voltage detection part 54. The PWM signal generation part 55 is configured to output the generated PWM signal to the duty restriction part 56 and the signal output control part 57.

The duty restriction part 56 is configured to use a duty lower limit value that is more than 0% and a duty upper limit value that is less than 100% to perform, every X cycles, duty restriction processing on the generated PWM signal input from the PWM signal generation part 55 in continuous Y cycles out of the X cycles. Moreover, the duty restriction part 56 is configured to output the generated PWM signal after the duty restriction processing to the transmission-side terminal T as a transmitted PWM signal.

On this occasion, X and Y are integers, and can be set in advance so as to satisfy X>Y>0. Moreover, the duty lower limit value can be set in advance so as to be more than 0%, and the duty upper limit value can be set in advance so as to be less than 100%.

In detail, the duty restriction part 56 directly outputs, every X cycles, the generated PWM signal in continuous (X−Y) cycles out of the X cycles to the transmission-side terminal T as the transmitted PWM signal. On the other hand, the duty restriction part 56 performs, every X cycles, the following duty adjustment on the generated PWM signal in the continuous Y cycles out of the X cycles, and then outputs the adjusted generated PWM signal to the transmission-side terminal T as the transmitted PWM signal.

In other words, the duty restriction part 56 adjusts the duty of the generated PWM signal in the continuous Y cycles so as to be the duty lower limit value when the duty is less than the duty lower limit value, and so as to be the duty upper limit value when the duty is more than the duty upper limit value. The duty restriction part 56 outputs the generated PWM signal to the transmission-side terminal T as it is as the transmitted PWM signal without adjusting the duty when the duty of the generated PWM signal in the Y cycles is equal to or less than the duty upper limit value and is equal to or more than the duty lower limit value.

The signal output control part 57 determines that a "reception abnormality exists" when the duty of the received PWM signal input from the reception-side terminal R is less than the duty lower limit value in continuous (X−Y+1) cycles. Moreover, the signal output control part 57 also determines that a "reception abnormality exists" when the duty of the received PWM signal input from the reception-side terminal R is more than the duty upper limit value in the continuous (X−Y+1) cycles. Further, the signal output control part 57 outputs the control PWM signal to the switching control part 53.

Figure 2:
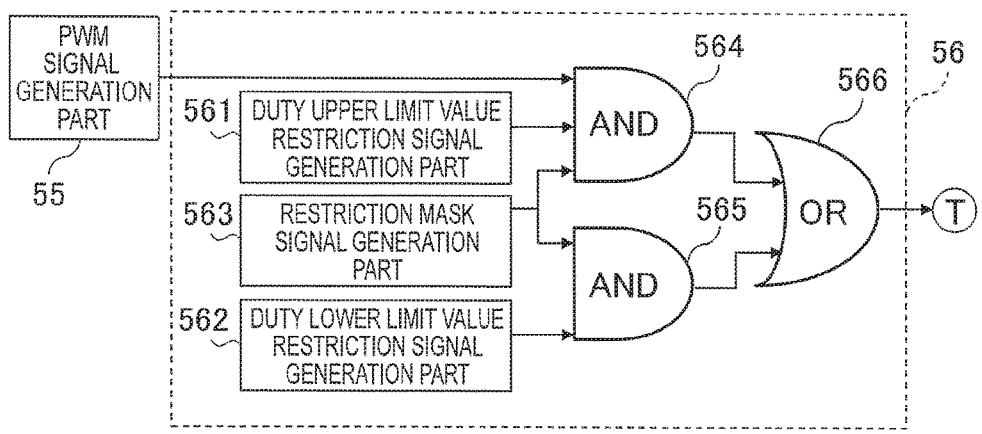
FIG. 2 is a configuration diagram for illustrating an example of a duty restriction part according to the first embodiment of the present invention.

Referring to FIG. 2, a description is now given of a configuration example of the duty restriction part 56. FIG. 2 is a configuration diagram for illustrating an example of the duty restriction part 56 according to the first embodiment of the present invention. In FIG. 2, the PWM signal generation part 55 and the transmission-side terminal T connected to the duty restriction part 56 are also illustrated.

The duty restriction part 56 includes a duty upper limit value restriction signal generation part 561, a duty lower limit value restriction signal generation part 562, a restriction mask signal generation part 563, a first AND gate 564, a second AND gate 565, and an OR gate 566.

The duty upper limit value restriction signal generation part 561 is configured to generate a duty upper limit value restriction signal for defining the duty upper limit value, and output the duty upper limit value restriction signal to the first AND gate 564. The duty lower limit value restriction signal generation part 562 is configured to generate a duty lower limit value restriction signal for defining the duty lower limit value, and output the duty lower limit value restriction signal to the second AND gate 565.

The restriction mask signal generation part 563 is configured to output to the first AND gate 564 and the second AND gate 565 a restriction mask signal for masking each of the duty upper limit value restriction signal and the duty lower limit value restriction signal in (X−Y) cycles out of the X cycles.

The generated PWM signal is input to the first AND gate 564 from the PWM signal generation part 55. The first AND gate 564 is configured to calculate a logical AND of the duty upper limit value restriction signal, the restriction mask signal, and the generated PWM signal, and output the logical AND to the OR gate 566.

The second AND gate 565 is configured to calculate a logical AND of the duty lower limit value restriction signal and the restriction mask signal, and output the logical AND to the OR gate 566.

The OR gate 566 is configured to calculate a logical OR of the calculation result input from the first AND gate 564 and the calculation result input from the second AND gate 565, and output the logical OR to the transmission-side terminal T as the transmitted PWM signal.

Figure 3:
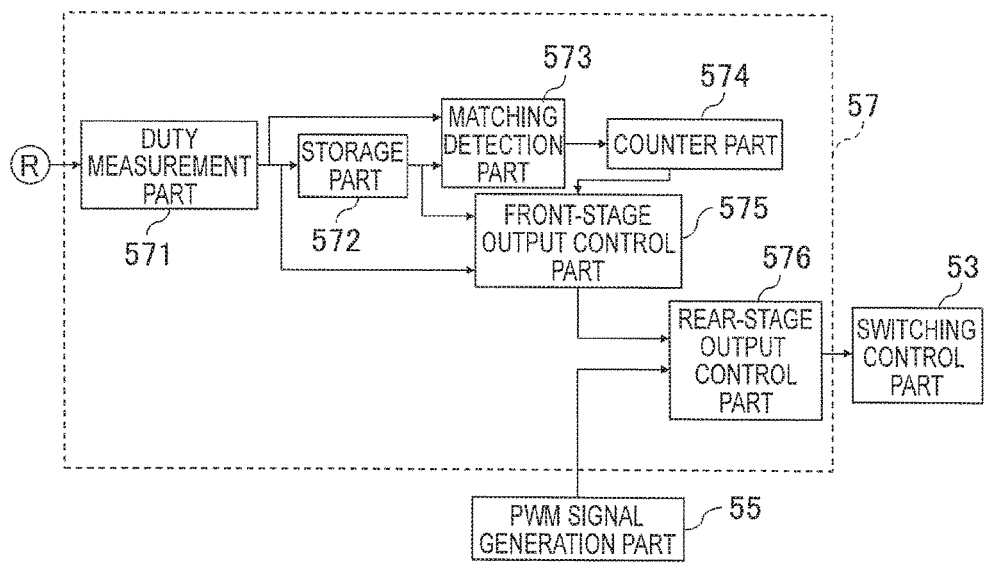
FIG. 3 is a configuration diagram for illustrating an example of a signal output control part according to the first embodiment of the present invention.

Referring to FIG. 3, a description is now given of a configuration example of the signal output control part 57. FIG. 3 is a configuration diagram for illustrating an example of the signal output control part 57 according to the first embodiment of the present invention. In FIG. 3, the switching control part 53, the PWM signal generation part 55, and the reception-side terminal R connected to the signal output control part 57 are also illustrated.

The signal output control part 57 includes a duty measurement part 571, a storage part 572, a matching detection part 573, a counter part 574, a front-stage output control part 575, and a rear-stage output control part 576.

The duty measurement part 571 is configured to measure, as a duty measurement value, the duty of the received PWM signal input from the reception-side terminal R, and output the duty measurement value to the storage part 572, the matching detection part 573, and the front-stage output control part 575. The storage part 572 is configured to store a currently newly input duty measurement value each time the duty measurement value is newly input from the duty measurement part 571, and set the duty measurement value input previously to be stored as a previous duty measurement value.

The matching detection part 573 is configured to compare the duty measurement value input from the duty measurement part 571 and the previous duty measurement value extracted from the storage part 572 with each other, and cause the counter part 574 to operate depending on a comparison result.

In detail, the matching detection part 573 transitions to an abnormality detection mode and sets a count to "0" when the duty measurement value is more than the duty upper limit value or less than the duty lower limit value.

The matching detection part 573 cancels the abnormality detection mode and resets the count to "0" when the matching detection part 573 determines that the duty measurement value and the previous duty measurement value do not match each other during the abnormality detection mode. Moreover, the matching detection part 573 increments the count by "1" when the matching detection part 573 determines that the duty measurement value and the previous duty measurement value match each other during the abnormality detection mode.

The counter part 574 is configured to output the count to the front-stage output control part 575. The front-stage output control part 575 is configured to determine whether or not the reception abnormality exists depending on the count input from the counter part 574. In detail, the front-stage output control part 575 determines that the reception abnormality exists when the count input from the counter part 574 is equal to or more than (X−Y), and determines that the reception abnormality does not exist when the count is less than (X−Y).

The front-stage output control part 575 is configured to extract the previous duty measurement value from the storage part 572 similarly to the matching detection part 573. The front-stage output control part 575 selects any one of the duty measurement value input from the duty measurement part 571 and the previous duty measurement value extracted from the storage part 572 depending on the count input from the counter part 574. Moreover, the front-stage output control part 575 demodulates the PWM signal from the selected duty, and outputs the PWM signal that has been demodulated to the rear-stage output control part 576 as a demodulated PWM signal.

The generated PWM signal is input to the rear-stage output control part 576 from the PWM signal generation part 55. The rear-stage output control part 576 is configured to output any one of the generated PWM signal input from the PWM signal generation part 55 and the demodulated PWM signal input from the front-stage output control part 575 to the switching control part 53 as the control PWM signal depending on whether or not the reception abnormality is determined to exist by the front-stage output control part 575.

Figure 4:
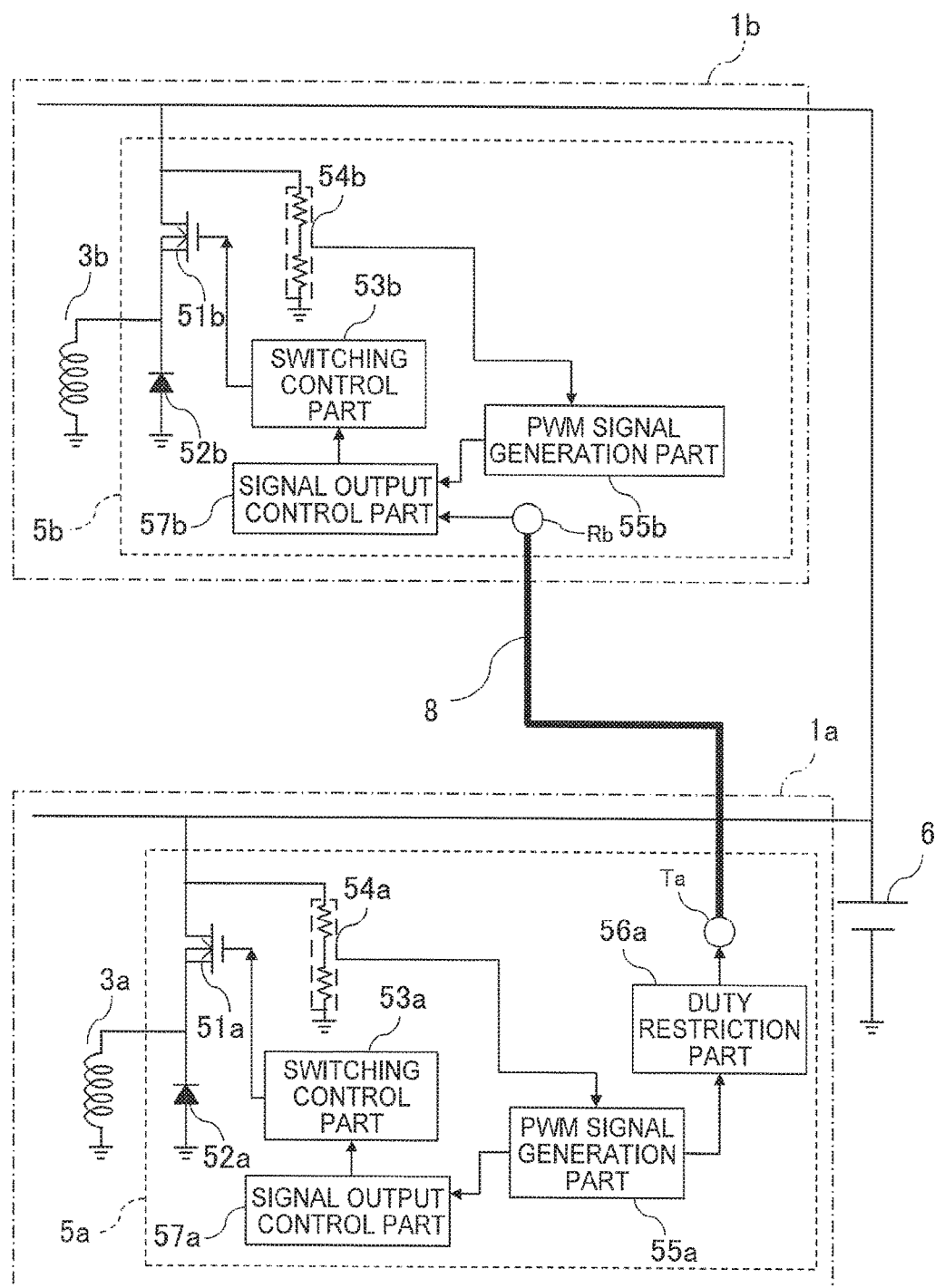
FIG. 4 is a configuration diagram for illustrating an example of a generator system according to the first embodiment of the present invention.

Referring to FIG. 4, a description is now given of a configuration of a generator system for causing a plurality of generators 1 to simultaneously generate electricity. FIG. 4 is a configuration diagram for illustrating an example of the generator system according to the first embodiment of the present invention. On this occasion, as illustrated in FIG. 4, a case where a master generator 1a and a slave generator 1b exist as two generators 1, and the transmission-side terminal T of the master generator 1a and the reception-side terminal R of the slave generator 1b are connected to each other via a cable 8 is exemplified.

The respective configurations of the master generator 1a and the slave generator 1b are the same as the configuration of the generator 1. Moreover, in the following, in order to clearly distinguish the master generator 1a and the slave generator 1b from each other, a suffix a is assigned to respective components of the master generator 1a, and a suffix b is assigned to respective components of the slave generator 1b. Further, in FIG. 4, only portions required for the description are illustrated, and portions not required for the description are omitted.

As appreciated from FIG. 4, the present invention is applied to the generator system including a first generator control device 5a configured to control, in accordance with a first control PWM signal, a field current to be supplied to a field coil 3a of a first generator corresponding to the master generator 1a and a second generator control device 5b configured to control, in accordance with a second control PWM signal, a field current to be supplied to a field coil 3b of a second generator corresponding to the slave generator 1b.

In this case, the transmitted PWM signal is transmitted from a transmission-side terminal Ta of the master generator 1a to a reception-side terminal Rb of the slave generator 1b via the cable 8. Moreover, nothing is connected to the reception-side terminal Ra of the master generator 1a, and the field coil 3a of the master generator 1a is thus controlled in accordance with a generated PWM signal generated by a PWM signal generation part 55a. In other words, the first control PWM signal is the generated PWM signal generated by the PWM signal generation part 55a.

A description is now given of the reception abnormality. When the transmitted PWM signal is transmitted from the transmission-side terminal Ta of the master generator 1a to the reception-side terminal Rb of the slave generator 1b, the transmitted PWM signal may not be normally received by the slave generator 1b. Specifically, when a short circuit to ground, a short circuit to power supply, or an open circuit occurs due to detachment of the cable 8 for connecting the transmission-side terminal Ta and the reception-side terminal Rb to each other or the like, the duty of the received PWM signal becomes a value more than the duty upper limit value or a value less than the duty lower limit value independently of the transmitted PWM signal. In the following, as an example, a value more than the duty upper limit value is 100%, and a value less than the duty lower limit value is 0%.

Moreover, a case is considered where the transmitted PWM signal having a duty of 100% is actually transmitted from the transmission-side terminal Ta of the master generator 1a to the reception-side terminal Rb of the slave generator 1b. In this case, the duty of the received PWM signal is received as 100% regardless of whether or not the reception abnormality is occurring, and even when the reception abnormality is occurring, the reception abnormality cannot be detected. The same also holds true for a case where the transmitted PWM signal having a duty of 0% is actually transmitted from the transmission-side terminal Ta of the master generator 1a to the reception-side terminal Rb of the slave generator 1b.

Thus, the present invention devises the following technical feature. Specifically, when the reception abnormality is occurring, the reception abnormality is detected regardless of the magnitude of the duty of the transmitted PWM signal transmitted from the transmission-side terminal Ta of the master generator 1a to the reception-side terminal Ra of the slave generator 1b.

A detailed description is now given of operations of the master generator 1a and the slave generator 1b when the reception-side terminal Rb is connected to the transmission-side terminal Ta via the cable 8 for each of the case where the reception abnormality is occurring and the case where the reception abnormality is not occurring.

Figure 5B:
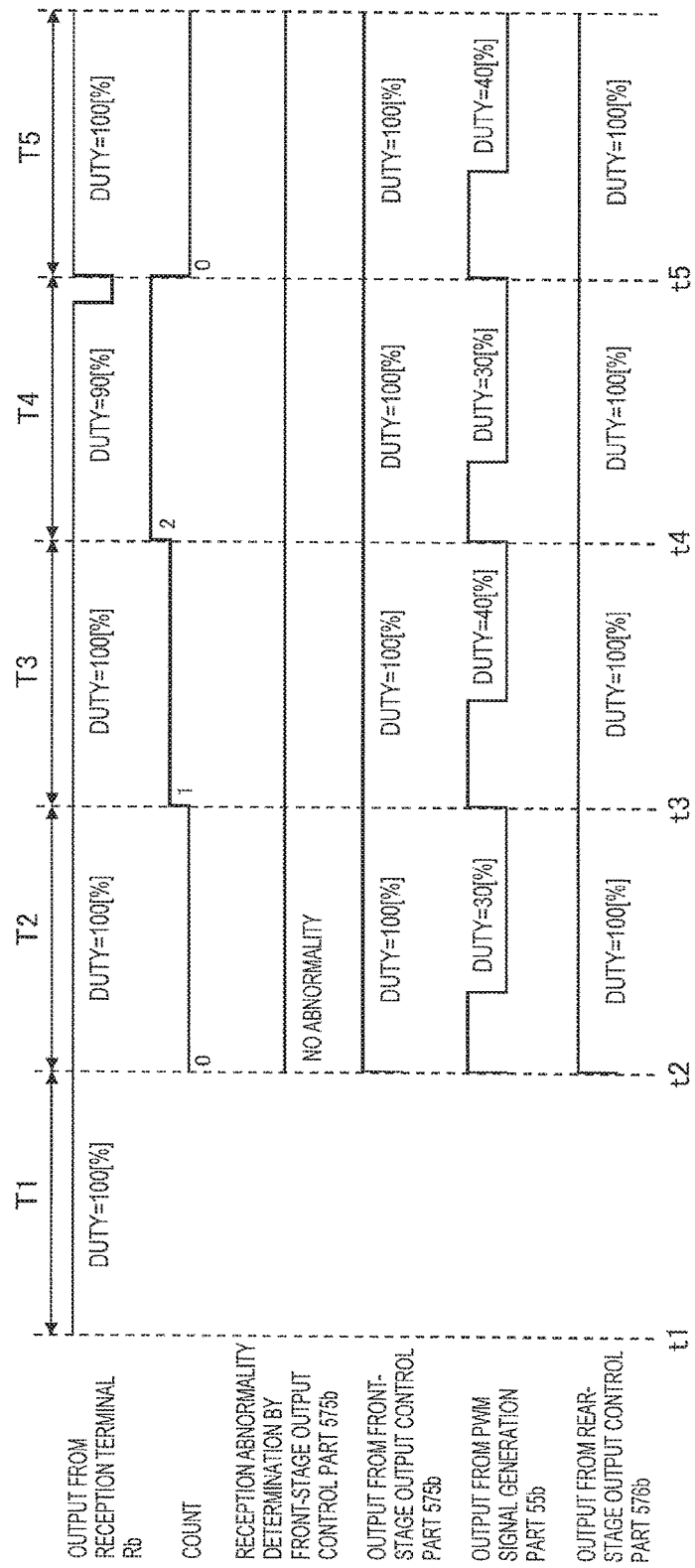
FIG. 5B is an explanatory diagram for illustrating a first example of a control PWM signal output by the signal output control part of a slave generator after the signal output control part receives the transmitted PWM signal illustrated in FIG. 5A when a reception abnormality is not occurring according to the first embodiment of the present invention.

FIG. 5A is an explanatory diagram for illustrating a first example of the transmitted PWM signal output by a duty restriction part 56a of the master generator 1a according to the first embodiment of the present invention. FIG. 5B is an explanatory diagram for illustrating a first example of the control PWM signal output by a signal output control part 57b of the slave generator 1b after the signal output control part 57b receives the transmitted PWM signal illustrated in FIG. 5A when the reception abnormality is not occurring according to the first embodiment of the present invention. FIG. 5C is an explanatory diagram for illustrating a first example of the control PWM signal output by the signal output control part 57b of the slave generator 1b after the signal output control part 57b receives the transmitted PWM signal illustrated in FIG. 5A when the reception abnormality is occurring according to the first embodiment of the present invention.

In FIG. 5A, FIG. 5B, and FIG. 5C, the master generator 1a and the slave generator 1b are operating under the following conditions.

Such a setting that X>Y (more specifically, X=4 and Y=1) is made.

Such settings that the duty upper limit value=90% and that the duty lower limit value=10% are made.

The duties of the generated PWM signals sequentially output by the PWM signal generation part 55a in respective cycles T1 to T4 are 100%, 100%, 100%, and 100%, respectively.

The duties of the generated PWM signals sequentially output by a PWM signal generation part 55b in respective cycles T2 to T5 are 30%, 40%, 30%, and 40%, respectively.

The duty of the received PWM signal received by the signal output control part 57b is 100% when the reception abnormality is occurring.

In FIG. 5A, such a setting that X=4 and Y=1 is made, and thus the duty restriction part 56a outputs the generated PWM signal in three cycles out of the generated PWM signal in four cycles as it is to the transmission-side terminal Ta as the transmitted PWM signal. On the other hand, the duty restriction part 56a adjusts the generated PWM signal in the one cycle out of the generated PWM signals in the four cycles so that the duty is 90%, and outputs the adjusted generated PWM signal to the transmission-side terminal Ta as the transmitted PWM signal.

Specifically, an OR gate 566a outputs the transmitted PWM signal having a duty of 100% to the transmission-side terminal Ta in the respective cycles T1 to T3. Moreover, the OR gate 566a outputs the transmitted PWM signal adjusted so that the duty is 90% to the transmission-side terminal Ta in the cycle T4.

In FIG. 5B, when the reception abnormality is not occurring, the duty of the transmitted PWM signal output by the duty restriction part 56a and the duty of the received PWM signal received by the signal output control part 57b are supposed to be the same.

Specifically, as illustrated in FIG. 5B, the duty of the received PWM signal received in the cycle T1 is 100%, and thus the duty measurement value measured by a duty measurement part 571b is 100% at a time t2. Therefore, the duty measurement value is larger than the duty upper limit value, and thus a matching detection part 573b transitions to the abnormality detection mode and resets the count to "0".

In this case, in the cycle T2, a front-stage output control part 575b outputs the demodulated PWM signal having a duty of 100%, which is the duty measurement value, to a rear-stage output control part 576b. Moreover, the rear-stage output control part 576b outputs the demodulated PWM signal input from the front-stage output control part 575b to a switching control part 53b as the control PWM signal.

Then, as illustrated in FIG. 5B, the duty of the received PWM signal received in the cycle T2 is 100%, and thus the duty measurement value measured by the duty measurement part 571b is 100% at a time t3. Moreover, the previous duty measurement value is the duty measurement value measured by the duty measurement part 571b at the time t2, and is thus 100%.

Thus, the matching detection part 573b determines that the duty measurement value and the previous duty measurement value match each other, and sets the count to "1". On this occasion, the state where the count is "1" represents that the output of the received PWM signal having a duty of 100% continues for the two cycles.

In this case, in the cycle T3, the front-stage output control part 575b outputs the demodulated PWM signal having a duty of 100%, which is the duty measurement value, to the rear-stage output control part 576b. Moreover, the rear-stage output control part 576b outputs the demodulated PWM signal input from the front-stage output control part 575b to the switching control part 53b as the control PWM signal.

Then, as illustrated in FIG. 5B, the duty of the received PWM signal received in the cycle T3 is 100%, and thus the duty measurement value measured by the duty measurement part 571b is 100% at a time t4. Moreover, the previous duty measurement value is the duty measurement value measured by the duty measurement part 571b at the time t3, and is thus 100%.

Thus, the matching detection part 573b determines that the duty measurement value and the previous duty measurement value match each other, and sets the count to "2". On this occasion, the state where the count is "2" represents that the output of the received PWM signal having a duty of 100% continues for the three cycles.

In this case, in the cycle T4, the front-stage output control part 575b outputs the demodulated PWM signal having a duty of 100%, which is the duty measurement value, to the rear-stage output control part 576b. Moreover, the rear-stage output control part 576b outputs the demodulated PWM signal input from the front-stage output control part 575b to the switching control part 53b as the control PWM signal.

In this way, when the duty of the current received PWM signal received in the current cycle (the cycle T3 in this case) and the duty of the previous received PWM signal received in the previous cycle (the cycle T2 in this case) match each other, and the signal output control part 57b does not determine that the reception abnormality exists in the current cycle, the signal output control part 57b controls the field current to be supplied to the field coil 3b based on the current received PWM signal in the next cycle (the cycle T4 in this case).

Then, as illustrated in FIG. 5B, the duty of the received PWM signal received in the cycle T4 becomes 90%, and thus the duty measurement value measured by the duty measurement part 571b is 90% at a time t5. Moreover, the previous duty measurement value is the duty measurement value measured by the duty measurement part 571b at the time t4, and is thus 100%. Thus, the matching detection part 573b determines that the duty measurement value and the previous duty measurement value do not match each other, and thus cancels the abnormality detection mode. Then, the matching detection part 573b resets the count to "0". On this occasion, the state where the abnormality detection mode is canceled and the count is "0" represents that the output of the received PWM signal having a duty of 100%, which has continued in the respective cycles T1 to T3, discontinues in the cycle T4.

In this case, in the cycle T5, the front-stage output control part 575b outputs the demodulated PWM signal having a duty of 100%, which is the previous duty measurement value, to the rear-stage output control part 576b. Moreover, the rear-stage output control part 576b outputs the demodulated PWM signal input from the front-stage output control part 575b to the switching control part 53b as the control PWM signal.

In this way, when the duty of the current received PWM signal received in the current cycle (the cycle T4 in this case) and the duty of the previous received PWM signal received in the previous cycle (the cycle T3 in this case) do not match each other, and the signal output control part 57b does not determine that the reception abnormality exists in the current cycle, the signal output control part 57b controls the field current to be supplied to the field coil 3b based on the previous received PWM signal in the next cycle (the cycle T5 in this case). As a result of the execution of the duty restriction processing by this control, even when the duty of the transmitted PWM signal is adjusted from 100% to 90%, the PWM signal having a duty of not 90% after the adjustment but 100% that is transmitted when the duty restriction processing is not performed can be used to control the field current to be supplied to the field coil 3b.

In FIG. 5C, when the reception abnormality is occurring, regardless of the duty of the transmitted PWM signal output by the duty restriction part 56a, the duty of the received PWM signal received by the signal output control part 57b is supposed to be a value more than the duty upper limit value. In FIG. 5C, the operation of the signal output control part 57b in the respective cycles T1 to T3 is the same as that of FIG. 5B, and a description thereof is therefore omitted.

As illustrated in FIG. 5C, the duty of the transmitted PWM signal transmitted in the cycle T4 is 90%, but a reception abnormality is occurring, and thus the duty of the received PWM signal received in the cycle T4 is 100%. As a result, at the time t5, the duty measurement value measured by the duty measurement part 571b is 100%. Moreover, the previous duty measurement value is the duty measurement value measured by the duty measurement part 571b at the time t4, and is thus 100%.

Thus, the matching detection part 573b determines that the duty measurement value and the previous duty measurement value match each other, and sets the count to "3". On this occasion, the state where the count is "3" represents that the output of the received PWM signal having a duty of 100% continues for the four cycles. Incidentally, when the reception abnormality is not occurring, the received PWM signal having a duty of 100% does not continue for the four cycles.

In other words, even when the duty of the generated PWM signal input from the PWM signal generation part 55a to the duty restriction part 56a is 100% in continuous four cycles, the duty of the generated PWM signal in one cycle out of the generated PWM signals in the four cycles is restricted. Therefore, the duty of the transmitted PWM signal output by the transmission-side terminal Ta is 90%, which is the duty upper limit value, in the one cycle out of the four cycles. Thus, unless the reception abnormality is occurring, the duty of the received PWM signal output by the reception-side terminal Rb is not 100% in the continuous four cycles.

Thus, when the count is "3", the front-stage output control part 575b determines that the reception abnormality exists.

In this case, in the cycle T5, the front-stage output control part 575b outputs the demodulated PWM signal having a duty of 100%, which is the duty measurement value, to the rear-stage output control part 576b. Moreover, the rear-stage output control part 576b outputs not the demodulated PWM signal input from the front-stage output control part 575b, but the generated PWM signal input from the PWM signal generation part 55b to the switching control part 53b as the control PWM signal.

In this way, the signal output control part 57b controls the field current to be supplied to the field coil 3b based on the PWM signal generated by the PWM signal generation part 55b in a cycle (the cycle T5 in this case) in which the reception abnormality is determined to exist.

As described above, as appreciated from FIG. 5A to FIG. 5C, even when the duty of the generated PWM signal input from the PWM signal generation part 55a to the duty restriction part 56a is more than the duty upper limit value in continuous X cycles, the duty of the transmitted PWM signal output by the transmission-side terminal Ta is the duty upper limit value in the Y cycles out of the X cycles.

On this occasion, when such a transmitted PWM signal is transmitted by the duty restriction part 56a, unless the reception abnormality is occurring, the duty of the received PWM signal output from the reception-side terminal Ra is not more than the duty upper limit value in continuous (X−Y+1) cycles. In other words, when the reception abnormality is occurring, the duty of the received PWM signal output by the reception-side terminal Ra is supposed to be more than the duty upper limit value in the continuous (X−Y+1) cycles.

The signal output control part 57b of the slave generator 1b determines that the reception abnormality exists when the duty of the received PWM signal input from the reception-side terminal Rb is more than the duty upper limit value in the continuous (X−Y+1) cycles. Thus, when the reception abnormality is actually occurring, the signal output control part 57b can detect the reception abnormality.

Figure 6A:
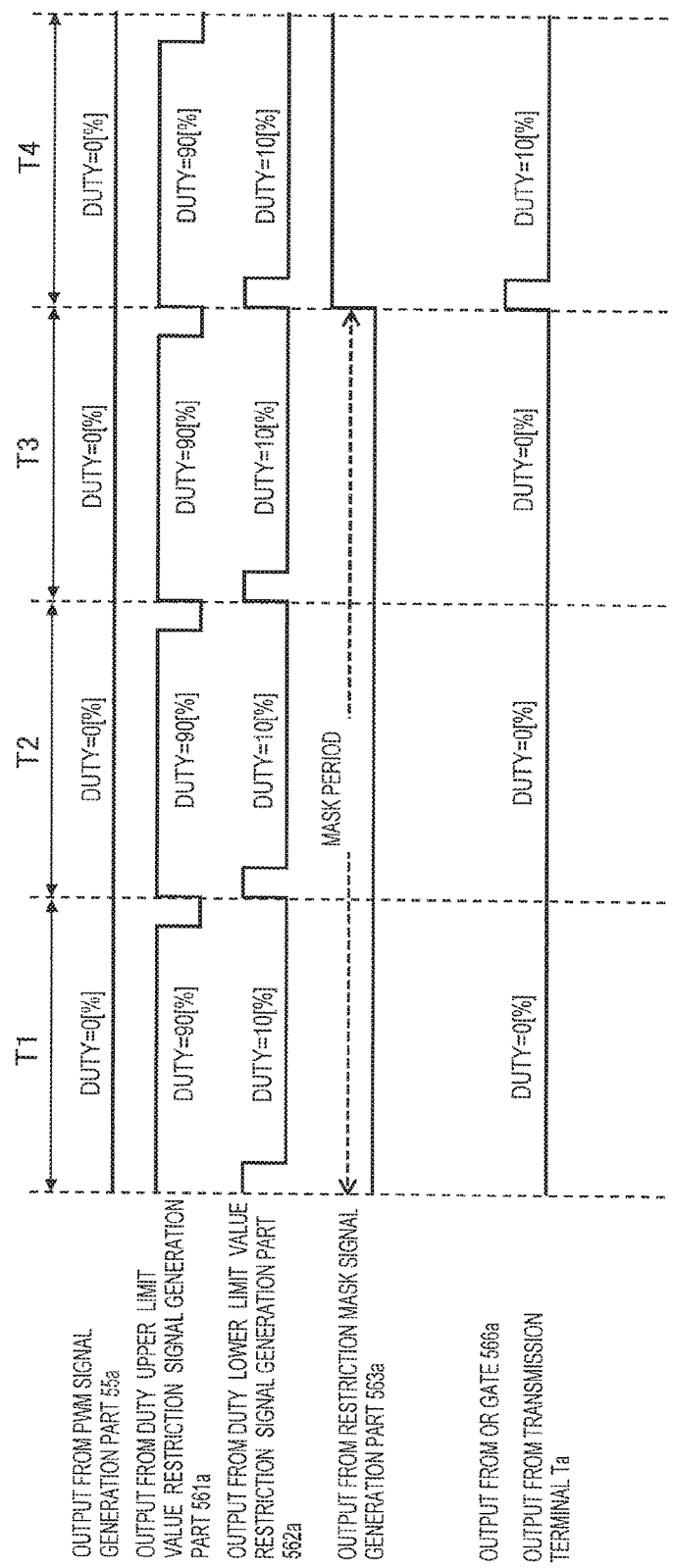
FIG. 6A is an explanatory diagram for illustrating a second example of the transmitted PWM signal output by the duty restriction part of the master generator according to the first embodiment of the present invention.
Figure 6B:
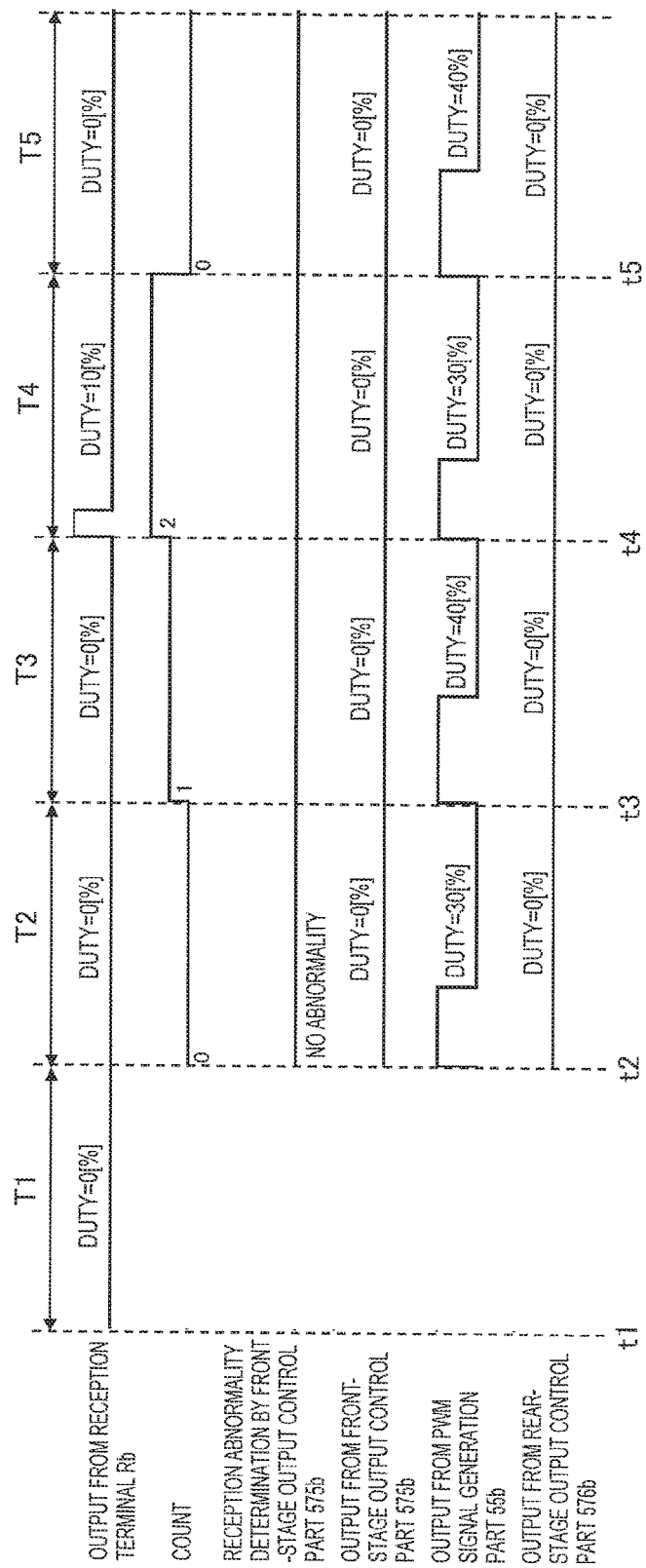
FIG. 6B is an explanatory diagram for illustrating a second example of the control PWM signal output by the signal output control part of the slave generator after the signal output control part receives the transmitted PWM signal illustrated in FIG. 6A when a reception abnormality is not occurring according to the first embodiment of the present invention.
Figure 6C:
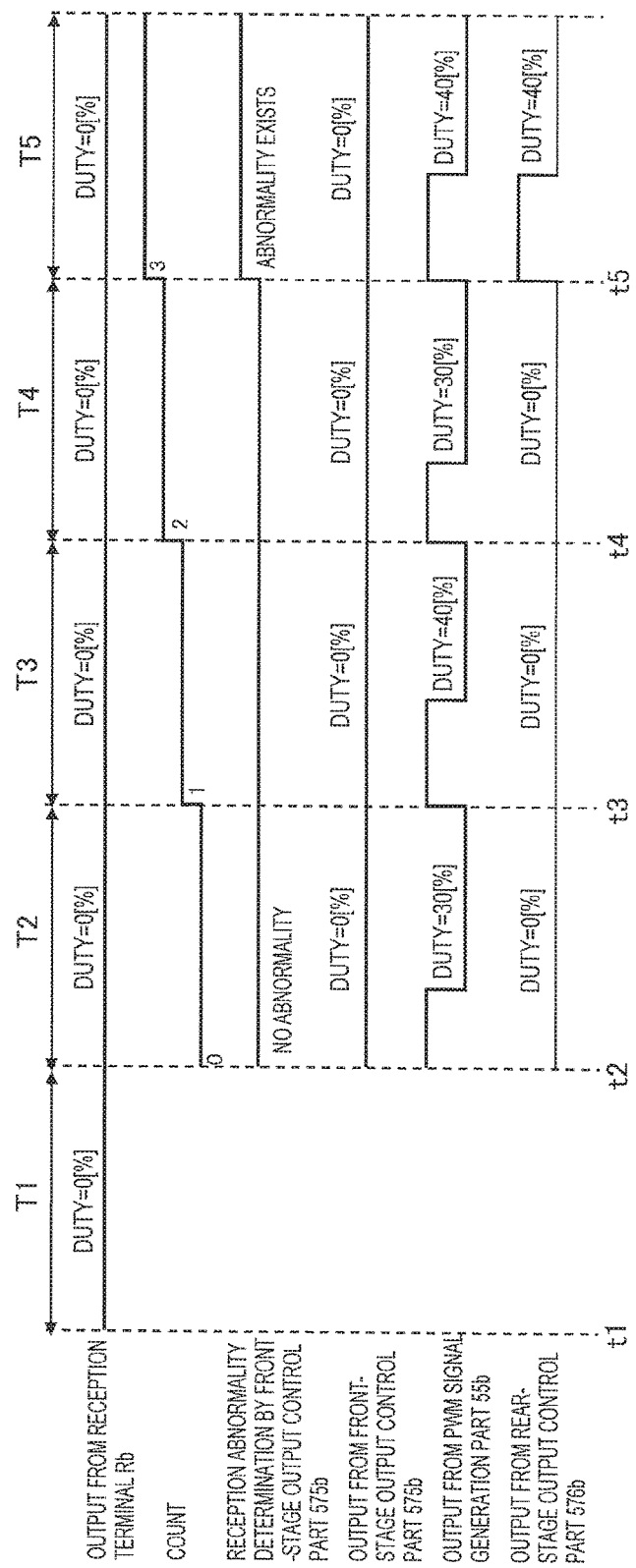
FIG. 6C is an explanatory diagram for illustrating a second example of the control PWM signal output by the signal output control part of the slave generator after the signal output control part receives the transmitted PWM signal illustrated in FIG. 6A when the reception abnormality is occurring according to the first embodiment of the present invention.

FIG. 6A is an explanatory diagram for illustrating a second example of the transmitted PWM signal output by the duty restriction part 56a of the master generator 1a according to the first embodiment of the present invention. FIG. 6B is an explanatory diagram for illustrating a second example of the control PWM signal output by the signal output control part 57b of the slave generator 1b after the signal output control part 57b receives the transmitted PWM signal illustrated in FIG. 6A when the reception abnormality is not occurring according to the first embodiment of the present invention. FIG. 6C is an explanatory diagram for illustrating a second example of the control PWM signal output by the signal output control part 57b of the slave generator 1b after the signal output control part 57b receives the transmitted PWM signal illustrated in FIG. 6A when the reception abnormality is occurring according to the second embodiment of the present invention.

In FIG. 6A, FIG. 6B, and FIG. 6C, the master generator 1a and the slave generator 1b are operating under the following conditions.

Such a setting that X>Y (more specifically, X=4 and Y=1) is made.

Such settings that the duty upper limit value=90% and that the duty lower limit value=10% are made.

The duties of the generated PWM signals sequentially output by the PWM signal generation part 55a in respective cycles T1 to T4 are 0%, 0%, 0%, and 0%, respectively.

The duties of the generated PWM signals sequentially output by the PWM signal generation part 55b in the respective cycles T2 to T5 are 30%, 40%, 30%, and 40%, respectively.

The duty of the received PWM signal received by the signal output control part 57b is 0% when the reception abnormality is occurring.

In FIG. 6A, such a setting that X=4 and Y=1 is made, and thus the duty restriction part 56a outputs the generated PWM signal in three cycles out of the generated PWM signal in four cycles as it is to the transmission-side terminal Ta as the transmitted PWM signal. On the other hand, the duty restriction part 56a adjusts the generated PWM signal in the one cycle out of the generated PWM signals in the four cycles so that the duty is 10%, and outputs the adjusted generated PWM signal to the transmission-side terminal Ta as the transmitted PWM signal.

Specifically, the OR gate 566a outputs the transmitted PWM signal having a duty of 0% to the transmission-side terminal Ta in the respective cycles T1 to T3. Moreover, the OR gate 566a outputs the transmitted PWM signal adjusted so that the duty is 10% to the transmission-side terminal Ta in the cycle T4.

In FIG. 6B, when the reception abnormality is not occurring, the duty of the transmitted PWM signal output by the duty restriction part 56a and the duty of the received PWM signal received by the signal output control part 57b are supposed to be the same.

Specifically, as illustrated in FIG. 6B, the duty of the received PWM signal received in the cycle T1 is 0%, and thus the duty measurement value measured by the duty measurement part 571b is 0% at the time t2. Therefore, the duty measurement value is less than the duty lower limit value, and thus the matching detection part 573b transitions to the abnormality detection mode and resets the count to "0".

In this case, in the cycle T2, the front-stage output control part 575b outputs the demodulated PWM signal having a duty of 0%, which is the duty measurement value, to the rear-stage output control part 576b. Moreover, the rear-stage output control part 576b outputs the demodulated PWM signal input from the front-stage output control part 575b to the switching control part 53b as the control PWM signal.

Then, as illustrated in FIG. 6B, the duty of the received PWM signal received in the cycle T2 is 0%, and thus the duty measurement value measured by the duty measurement part 571b is 0% at the time t3. Moreover, the previous duty measurement value is the duty measurement value measured by the duty measurement part 571b at the time t2, and is thus 0%.

Thus, the matching detection part 573b determines that the duty measurement value and the previous duty measurement value match each other, and sets the count to "1". On this occasion, the state where the count is "1" represents that the output of the received PWM signal having a duty of 0% continues for the two cycles.

In this case, in the cycle T3, the front-stage output control part 575b outputs the demodulated PWM signal having a duty of 0%, which is the duty measurement value, to the rear-stage output control part 576b. Moreover, the rear-stage output control part 576b outputs the demodulated PWM signal input from the front-stage output control part 575b to the switching control part 53b as the control PWM signal.

Then, as illustrated in FIG. 6B, the duty of the received PWM signal received in the cycle T3 is 0%, and thus the duty measurement value measured by the duty measurement part 571b is 0% at the time t4. Moreover, the previous duty measurement value is the duty measurement value measured by the duty measurement part 571b at the time t3, and is thus 0%.

Thus, the matching detection part 573b determines that the duty measurement value and the previous duty measurement value match each other, and sets the count to "2". On this occasion, the state where the count is "2" represents that the output of the received PWM signal having a duty of 0% continues for the three cycles.

In this case, in the cycle T4, the front-stage output control part 575b outputs the demodulated PWM signal having a duty of 0%, which is the duty measurement value, to the rear-stage output control part 576b. Moreover, the rear-stage output control part 576b outputs the demodulated PWM signal input from the front-stage output control part 575b to the switching control part 53b as the control PWM signal.

In this way, when the duty of the current received PWM signal received in the current cycle (the cycle T3 in this case) and the duty of the previous received PWM signal received in the previous cycle (the cycle T2 in this case) match each other, and the signal output control part 57b does not determine that the reception abnormality exists in the current cycle, the signal output control part 57b controls the field current to be supplied to the field coil 3b based on the current received PWM signal in the next cycle (the cycle T4 in this case).

Then, as illustrated in FIG. 6B, the duty of the received PWM signal received in the cycle T4 becomes 10%, and thus the duty measurement value measured by the duty measurement part 571b is 10% at the time t5. Moreover, the previous duty measurement value is the duty measurement value measured by the duty measurement part 571b at the time t4, and is thus 0%. Therefore, the matching detection part 573b determines that the duty measurement value and the previous duty measurement value do not match each other, and thus cancels the abnormality detection mode. Then, the matching detection part 573b resets the count to "0". On this occasion, the state where the abnormality detection mode is canceled and the count is "0" represents that the output of the received PWM signal having a duty of 0%, which has continued in the respective cycles T1 to T3, discontinues in the cycle T4.

In this case, in the cycle T5, the front-stage output control part 575b outputs the demodulated PWM signal having a duty of 0%, which is the previous duty measurement value, to the rear-stage output control part 576b. Moreover, the rear-stage output control part 576b outputs the demodulated PWM signal input from the front-stage output control part 575b to the switching control part 53b as the control PWM signal.

In this way, when the duty of the current received PWM signal received in the current cycle (the cycle T4 in this case) and the duty of the previous received PWM signal received in the previous cycle (the cycle T3 in this case) do not match each other, and the signal output control part 57b does not determine that the reception abnormality exists in the current cycle, the signal output control part 57b controls the field current to be supplied to the field coil 3b based on the previous received PWM signal in the next cycle (the cycle T5 in this case).

In FIG. 6C, when the reception abnormality is occurring, regardless of the duty of the transmitted PWM signal output by the duty restriction part 56a, the duty of the received PWM signal received by the signal output control part 57b is supposed to be a value less than the duty lower limit value. In FIG. 6C, the operation of the signal output control part 57b in the respective cycles T1 to T3 is the same as that of FIG. 6B, and a description thereof is therefore omitted.

As illustrated in FIG. 6C, the duty of the transmitted PWM signal transmitted in the cycle T4 is 10%, but a reception abnormality is occurring, and thus the duty of the received PWM signal received in the cycle T4 is 0%. As a result, at the time t5, the duty measurement value measured by the duty measurement part 571b is 0%. Moreover, the previous duty measurement value is the duty measurement value measured by the duty measurement part 571b at the time t4, and is thus 0%.

Thus, the matching detection part 573b determines that the duty measurement value and the previous duty measurement value match each other, and sets the count to "3". On this occasion, the state where the count is "3" represents that the output of the received PWM signal having a duty of 0% continues for the four cycles. Further, when the reception abnormality is not occurring, the output of the received PWM signal having a duty of 0% does not continue for the four cycles.

In other words, even when the duty of the generated PWM signal input from the PWM signal generation part 55a to the duty restriction part 56a is 0% in continuous four cycles, the duty of the generated PWM signal in one cycle out of the generated PWM signals in the four cycles is restricted. Therefore, the duty of the transmitted PWM signal output by the transmission-side terminal Ta is 10%, which is the duty upper limit value, in the one cycle out of the four cycles. Thus, unless the reception abnormality is occurring, the duty of the received PWM signal output by the reception-side terminal Rb is not 0% in the continuous four cycles.

Thus, when the count is "3", the front-stage output control part 575b determines that the reception abnormality exists.

In this case, in the cycle T5, the front-stage output control part 575b outputs the demodulated PWM signal having a duty of 0%, which is the duty measurement value, to the rear-stage output control part 576b. Moreover, the rear-stage output control part 576b outputs not the demodulated PWM signal input from the front-stage output control part 575b, but the generated PWM signal input from the PWM signal generation part 55b to the switching control part 53b as the control PWM signal.

In this way, the signal output control part 57b controls the field current to be supplied to the field coil 3b based on the PWM signal generated by the PWM signal generation part 55b in a cycle (the cycle T5 in this case) in which the reception abnormality is determined to exist.

As described above, as appreciated from FIG. 6A to FIG. 6C, even when the duty of the generated PWM signal input from the PWM signal generation part 55a to the duty restriction part 56a is less than the duty lower limit value in continuous X cycles, the duty of the transmitted PWM signal output by the transmission-side terminal Ta is the duty lower limit value in the Y cycles out of the X cycles.

On this occasion, when such a transmitted PWM signal is transmitted by the duty restriction part 56a, unless the reception abnormality is occurring, the duty of the received PWM signal output from the reception-side terminal Ra is not less than the duty lower limit value in continuous (X−Y+1) cycles. In other words, when the reception abnormality is occurring, the duty of the received PWM signal output by the reception-side terminal Ra is supposed to be less than the duty lower limit value in the continuous (X−Y+1) cycles.

The signal output control part 57b of the slave generator 1b determines that the reception abnormality exists when the duty of the received PWM signal input from the reception-side terminal Rb is less than the duty lower limit value in the continuous (X−Y+1) cycles. Thus, when the reception abnormality is actually occurring, the signal output control part 57b can detect the reception abnormality.

Figure 7:
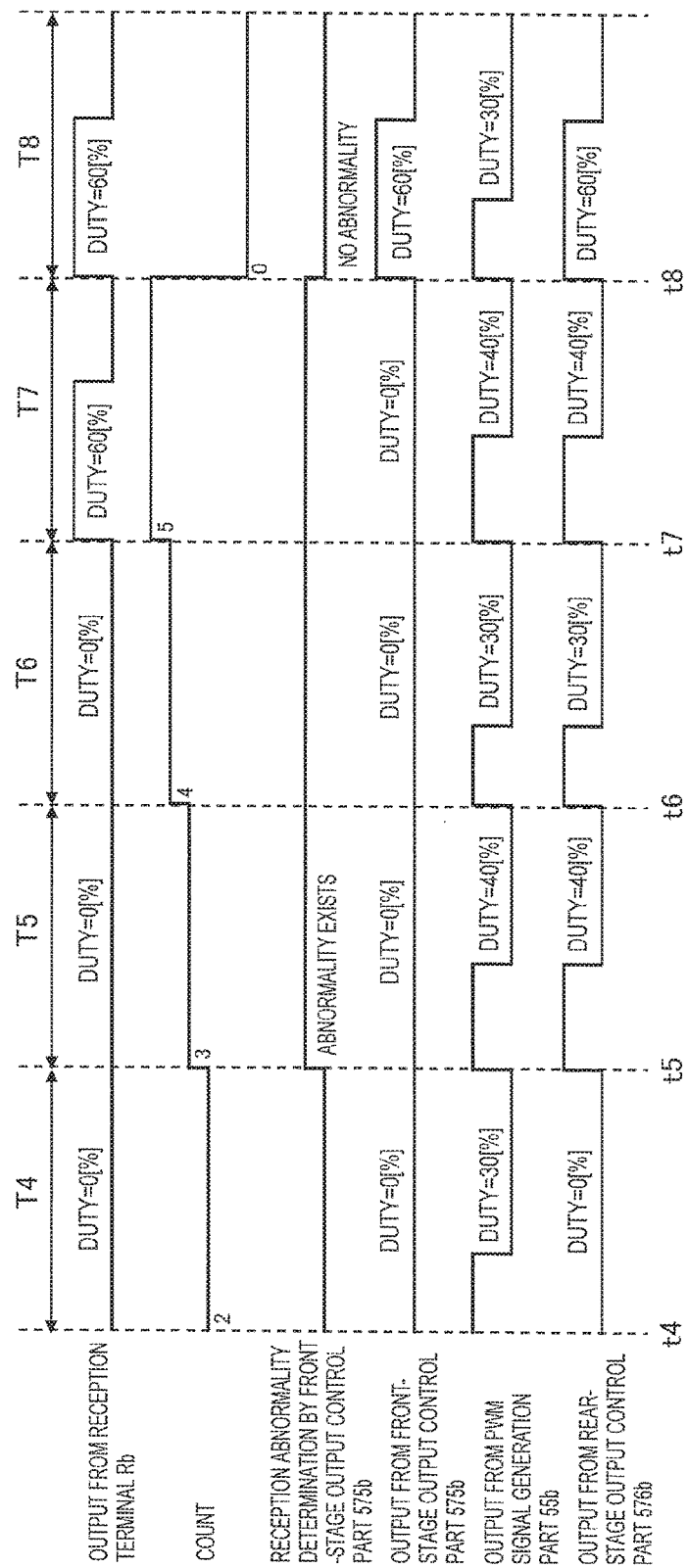
FIG. 7 is an explanatory diagram for illustrating an example of the control PWM signal output by the signal output control part of the slave generator when the signal output control part determines that the reception abnormality exists according to the first embodiment of the present invention.

Next, referring to FIG. 7, a description is given of an example of the control PWM signal output by the rear-stage output control part 576b after the front-stage output control part 575b of the slave generator 1b determines that the reception abnormality exists. FIG. 7 is an explanatory diagram for illustrating the example of the control PWM signal output by the signal output control part 57b of the slave generator 1b when the signal output control part 57b determines that the reception abnormality exists according to the first embodiment of the present invention.

In FIG. 7, the original transmitted PWM signal input from the transmission-side terminal Ta of the master generator 1a to the reception-side terminal Rb of the slave generator 1b is the transmitted PWM signal illustrated in FIG. 6A in the cycles T1 to T4, and is a transmitted PWM signal having a duty of 60% in a cycle T5 to a cycle T8. Moreover, the reception abnormality occurs until a time t7, and the reception abnormality returns to a reception normality at the time t7 and no longer occurs.

The outputs of the respective components in the cycles T1 to T5 are the same as those of FIG. 6C, and thus, in FIG. 7, the outputs of the respective components in the cycles T4 and T5 are illustrated, whereas the illustration of the outputs of the respective components in the cycles T1 to T3 is omitted. Moreover, in FIG. 7, the operation of the signal output control part 57b in the respective cycles T1 to T4 is the same as that of FIG. 6C, and a description thereof is therefore omitted.

The duty of the transmitted PWM signal transmitted in the cycle T5 is 60%, but the duty of the received PWM signal received in the cycle T5 is 0% due to the occurrence of the reception abnormality, and thus the duty measurement value measured by the duty measurement part 571b is 0% at a time t6. Moreover, at the time t5, the previous duty measurement value measured by the duty measurement part 571b is 0%. Thus, the matching detection part 573b determines that the duty measurement value and the previous duty measurement value match each other, and sets the count from "3" to "4".

The state where the count is "4" represents that the output of the received PWM signal having a duty less than the duty lower limit value continues for the five cycles. Thus, when the count is "4", the front-stage output control part 575b continues to determine that the reception abnormality exists. In this case, in the cycle T6, the front-stage output control part 575b outputs the demodulated PWM signal having a duty of 0%, which is the duty measurement value, to the rear-stage output control part 576b.

Moreover, in the cycle T6, the rear-stage output control part 576b outputs not the demodulated PWM signal input from the front-stage output control part 575b, but the generated PWM signal input from the PWM signal generation part 55b to the switching control part 53b as the control PWM signal.

Then, the duty of the transmitted PWM signal transmitted in the cycle T6 is 60%, but the duty of the received PWM signal received in the cycle T6 is 0% due to the occurrence of the reception abnormality, and thus the duty measurement value measured by the duty measurement part 571b is 0% at the time t7. Moreover, at the time t6, the previous duty measurement value measured by the duty measurement part 571b is 0%. Thus, the matching detection part 573b determines that the duty measurement value and the previous duty measurement value match each other, and sets the count from "4" to "5".

The state where the count is "5" represents that the output of the received PWM signal having a duty less than the duty lower limit value continues for the six cycles. Thus, when the count is "5", the front-stage output control part 575b continues to determine that the reception abnormality exists. In this case, in the cycle T7, the front-stage output control part 575b outputs the demodulated PWM signal having a duty of 0%, which is the duty measurement value, to the rear-stage output control part 576b.

Moreover, in the cycle T7, the rear-stage output control part 576b outputs not the demodulated PWM signal input from the front-stage output control part 575b, but the generated PWM signal input from the PWM signal generation part 55b to the switching control part 53b as the control PWM signal.

Then, the duty of the transmitted PWM signal transmitted in the cycle T7 is 60%, but the duty of the received PWM signal received in the cycle T7 is 60% due to the return to the reception normality, and thus the duty measurement value measured by the duty measurement part 571b is 60% at a time t8. Moreover, at the time t7, the previous duty measurement value measured by the duty measurement part 571b is 0%. Thus, the matching detection part 573b determines that the duty measurement value and the previous duty measurement value do not match each other, and resets the count to "0".

The state where the count is reset to "0" represents that the output of the received PWM signal having a duty less than the duty lower limit value, which has continued in the respective cycles, discontinues. Thus, when the count is "0", the front-stage output control part 575b determines that the reception abnormality does not exist. In this case, in the cycle T8, the front-stage output control part 575b outputs the demodulated PWM signal having a duty of 60%, which is the previous duty measurement value, to the rear-stage output control part 576b.

Moreover, in the cycle T8, the rear-stage output control part 576b outputs the demodulated PWM signal input from the front-stage output control part 575b to the switching control part 53b as the control PWM signal.

As a result of the above-mentioned control, the switching control for the slave generator 1b is carried out by using the signal generated by the PWM signal generation part 55b in the slave generator 1b in the cycles T5 to T7 in which the reception abnormality is determined to exist. Further, the switching control for the slave generator 1b is carried out equally to the master generator 1a by using the signal generated by the PWM signal generation part 55a in the master generator 1a in the cycles T1 to T4, and T8 in which the reception abnormality is determined not to exist.

A description is now given of effects provided by the present invention while referring to a comparative example. As a comparative example of the present invention, a case is considered where the duty restriction part 56 carries out the duty restriction processing on the generated PWM signal input from the PWM signal generation part 55 in all cycles. In other words, this case is equivalent in meaning to a case where the value of Y is set to be the same as the value of X (X=Y).

In this case, when the duty of the generated PWM signal input from the PWM signal generation part 55a to the duty restriction part 56a is 0%, the duty of the transmission PWM output by the transmission-side terminal Ta is 10%, which is the duty lower limit value. Thus, when the duty of the generated PWM signal input from the PWM signal generation part 55a to the duty restriction part 56a is 0%, the transmitted PWM signal having a duty of 0% cannot be transmitted to the signal output control part 57b. The same holds true for the case where the duty of the generated PWM signal input from the PWM signal generation part 55a to the duty restriction part 56a is 100% in continuous X cycles.

Thus, as long as X=Y, the range of the duty of the transmitted PWM signal received from the master generator 1a by the slave generator 1b is restricted to a range of 10% or more and 90% or less, and power-generation efficiency of the generator cannot thus be increased.

In contrast, according to the present invention, when the duty of the generated PWM signal input from the PWM signal generation part 55a to the duty restriction part 56a is 0% in the continuous X cycles, the duty of the transmission PWM output by the transmission side Ta is 10%, which is the duty lower limit value, in the Y cycles out of the X cycles, and is 0% in the X-Y cycles out of the X cycles.

In other words, when the duty of the generated PWM signal input from the PWM signal generation part 55a to the duty restriction part 56a is 0%, the transmitted PWM signal having a duty of the duty lower limit value is transmitted to the signal output control part 57b in the Y cycles out of the X cycles. On the other hand, the transmitted PWM signal having a duty of 0% can be transmitted to the signal output control part 57b in the X–Y cycles out of the X cycles. An average of the duties of the transmitted PWM signals per cycle out of the X cycles is (10Y/X) %. For example, when X=4 and Y=1, this average is 2.5%.

In this way, according to the present invention, even when the duty of the generated PWM signal input from the PWM signal generation part 55a to the duty restriction part 56a is 0% in the continuous X cycles, the reception abnormality can be detected, and the average of the duties of the transmitted PWM signal per cycle of the continuous X cycles can be (10Y/X) % by making such a setting as X>Y. Therefore, the duty of the transmitted PWM signal transmitted from the master generator 1a to the slave generator 1b can be caused to approach the duty of the generated PWM signal for controlling the field coil 3a of the master generator 1a.

Thus, when the reception abnormality on the slave generator 1b side does not occur, the master generator 1a and the slave generator 1b can be controlled by using duties equivalent to each other so as to maintain the power-generation balance to be equal. Moreover, when the reception abnormality on the slave generator 1b side occurs, the master generator 1a and the slave generator 1b can be controlled by using the individual duties while detecting such reception abnormality. Further, the margin of the duty of the transmitted PWM signal received by the slave generator 1b from the master generator 1a increases, and thus the generation efficiency of the generator can be increased.

The front-stage output control part 575 may further be provided with a function of determining whether or not the cycle of the received PWM signal output by the reception-side terminal R is a normal value set in advance, and determining that the reception abnormality exists when the cycle of the received PWM signal is not the normal value set in advance. When such a function is added, the received PWM signal is directly input from the reception-side terminal R to the front-stage output control part 575.

Figure 8:
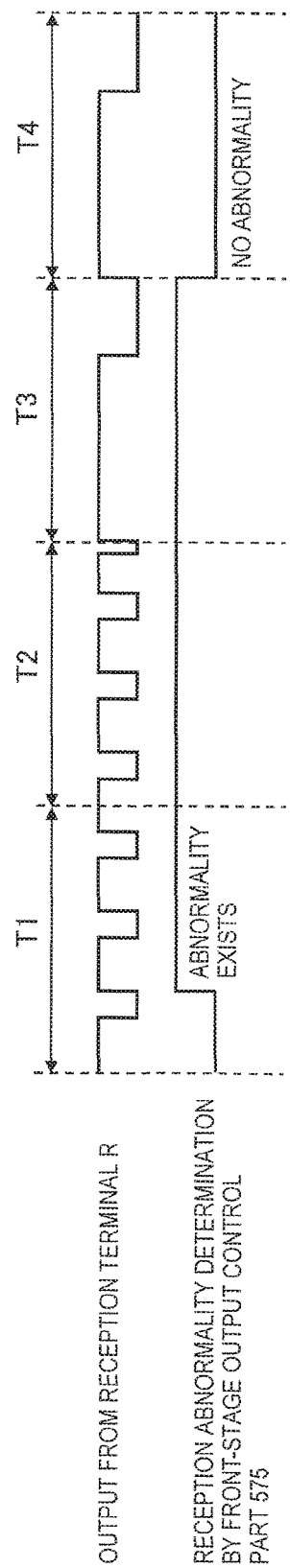
FIG. 8 is an explanatory diagram for illustrating an operation of a front-stage output control part of determining that the reception abnormality exists according to the first embodiment of the present invention.

FIG. 8 is an explanatory diagram for illustrating an operation of the front-stage output control part 575 of determining that the reception abnormality exists according to the first embodiment of the present invention. In FIG. 8, the front-stage output control part 575 determines that the reception abnormality exists when the cycle of the received PWM signal is no longer the normal value. Moreover, the front-stage output control part 575 determines that the reception abnormality does not exist at a timing at which the cycle of the received PWM signal becomes the normal value. With this configuration, a reception abnormality of a type other than the reception abnormality of the above-mentioned type can also be detected.

As described above, according to the first embodiment, the master generator is configured to use the duty lower limit value and the duty upper limit value to perform the duty restriction processing on the PWM signal in the continuous Y cycles out of the generated X cycles, and transmit the PWM signal after the restriction processing to the slave generator. Moreover, the slave generator is configured to receive the PWM signal after the restriction processing transmitted from the master generator as the received PWM signal, and determine that the reception abnormality exists when the received PWM signal is received as a signal representing the duty less than the duty lower limit value or the duty more than the duty upper limit value in continuous (X−Y+1) cycles.

As a result, the slave generator can detect the reception abnormality, and further, the margin of the duty of the PWM signal that can be transmitted from the master generator to the slave generator is the full range (0% or more and 100% or less). Therefore, the power-generation efficiency of the slave generator can be increased while the reception abnormality detection function is provided. Moreover, the reception abnormality detection function can be implemented by a small-scale circuit.

The invention claimed is:

1. A generator system, comprising:
a first generator control device comprising a first PWM signal generation part configured to generate a first PWM signal, the first generator control device being configured to control, based on the first PWM signal, a first field current to be supplied to a field coil of a first generator; and
a second generator control device comprising a second PWM signal generation part configured to generate a second PWM signal, the second generator control device being configured to control, based on the second PWM signal, a second field current to be supplied to a field coil of a second generator, wherein:
the first generator control device further comprises a duty restriction part configured to use a duty lower limit value that is more than 0% and a duty upper limit value that is less than 100% to perform, every X cycles, duty restriction processing on the first PWM signal generated by the first PWM signal generation part in continuous Y cycles out of the X cycles, and to transmit the first PWM signal after the restriction processing to the second generator control device;
the second generator control device further comprises a signal output control part configured to:
    receive the first PWM signal after the restriction processing transmitted from the duty restriction part as a received PWM signal;
    determine that a reception abnormality exists when the received PWM signal is received continuously in (X−Y+1) cycles as a signal representing a duty less than the duty lower limit value or a duty more than the duty upper limit value;
    control the second field current based on the second PWM signal generated by the second PWM signal generation part in a cycle in which the reception abnormality is determined to exist; and
    control the second field current based on the received PWM signal in a cycle in which the reception abnormality is not determined to exist; and
X and Y are integers satisfying X>Y>0.

2. A generator system according to claim 1, wherein when, regarding the received PWM signal, a duty of a current received PWM signal received in a current cycle and a duty of a previous received PWM signal received in a previous cycle match each other, and the reception abnormality is not determined to exist in the current cycle, the signal output control part controls the second field current based on the current received PWM signal in a next cycle.

3. A generator system according to claim 1, wherein when a duty of a current received PWM signal received in a current cycle and a duty of a previous received PWM signal received in a previous cycle do not match each other, and the reception abnormality is not determined to exist in the current cycle, the signal output control part controls the second field current based on the previous received PWM signal in a next cycle.

4. A generator control device, which is to be applied to the generator system of claim 1, and comprises any one of the first generator control device and the second generator control device.

5. A power-generation balance control method for a generator system, for equalizing a power-generation balance between a first generator and a second generator in the generator system, the generator system comprising:
  a first generator control device comprising a first PWM signal generation part configured to generate a first PWM signal, the first generator control device being configured to control, based on the first PWM signal, a first field current to be supplied to a field coil of the first generator; and
  a second generator control device comprising a second PWM signal generation part configured to generate a second PWM signal, the second generator control device being configured to control, based on the second PWM signal, a second field current to be supplied to a field coil of the second generator, the power-generation balance control method comprising:
a duty restriction processing step of using, by the first generator control device, a duty lower limit value that is more than 0% and a duty upper limit value that is less than 100% to perform, every X cycles, duty restriction processing on the first PWM signal generated by the first PWM signal generation part in continuous Y cycles out of the X cycles, and transmitting the first PWM signal after the restriction processing to the second generator control device; and a signal output control step of receiving, by the second generator control device, the first PWM signal after the restriction processing transmitted from the first generator control device in the duty restriction processing step as a received PWM signal, determining that a reception abnormality exists when the received PWM signal is received continuously in (X−Y+1) cycles as a signal representing a duty less than the duty lower limit value or a duty more than the duty upper limit value, controlling the second field current based on the second PWM signal generated by the second PWM signal generation part in a cycle in which the reception abnormality is determined to exist, and controlling the second field current based on the received PWM signal in a cycle in which the reception abnormality is not determined to exist, wherein X and Y are integers satisfying X>Y>0.

* * * * *